US011025245B2

(12) United States Patent
Hiyama et al.

(10) Patent No.: US 11,025,245 B2
(45) Date of Patent: Jun. 1, 2021

(54) POWER CONVERSION DEVICE

(71) Applicant: Mitsubishi Electric Corporation, Tokyo (JP)

(72) Inventors: Kazuaki Hiyama, Tokyo (JP); Yosuke Nakata, Tokyo (JP); Kentaro Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/615,613

(22) PCT Filed: Feb. 27, 2018

(86) PCT No.: PCT/JP2018/007133
§ 371 (c)(1),
(2) Date: Nov. 21, 2019

(87) PCT Pub. No.: WO2019/038957
PCT Pub. Date: Feb. 28, 2019

(65) Prior Publication Data
US 2020/0186140 A1 Jun. 11, 2020

(30) Foreign Application Priority Data
Aug. 24, 2017 (JP) .............................. JP2017-160726

(51) Int. Cl.
*H02M 7/539* (2006.01)
*H03K 17/082* (2006.01)
*H02M 1/08* (2006.01)
*H03K 17/08* (2006.01)

(52) U.S. Cl.
CPC .......... *H03K 17/0828* (2013.01); *H02M 1/08* (2013.01); *H02M 7/539* (2013.01); *H03K 2017/0806* (2013.01)

(58) Field of Classification Search
CPC ....... H03K 17/0828; H03K 2017/0806; H03K 2217/0027; H03K 17/08; H02M 1/08;
(Continued)

(56) References Cited

U.S. PATENT DOCUMENTS

2001/0002782 A1 6/2001 Shimane et al.
2003/0072117 A1 4/2003 Maekawa et al.
(Continued)

FOREIGN PATENT DOCUMENTS

DE  102 18 070 A1  5/2003
DE  103 56 468 A1  10/2004
(Continued)

OTHER PUBLICATIONS

International Search Report issued in PCT/JP2018/007133; dated Apr. 17, 2018.
(Continued)

*Primary Examiner* — Thienvu V Tran
*Assistant Examiner* — Peter M Novak
(74) *Attorney, Agent, or Firm* — Studebaker & Brackett PC

(57) ABSTRACT

The present invention relates to a control circuit controlling a switching device. The control circuit is a control circuit controlling first and second switching devices which are serially connected between first potential and second potential lower than the first potential and operate in a complementary manner. The control circuit includes a first control circuit controlling the first switching device and a second control circuit controlling the second switching device, and performs variable control of a circuit constant of each of the first and second control circuits based on a temperature of one of the first and second switching devices.

1 Claim, 4 Drawing Sheets

(58) Field of Classification Search
CPC .......... H02M 7/539; H02M 2001/327; H02M 2001/0029
See application file for complete search history.

(56) References Cited

U.S. PATENT DOCUMENTS

| | | |
|---|---|---|
| 2004/0196678 A1 | 10/2004 | Yoshimura et al. |
| 2005/0083025 A1 | 4/2005 | Brown |
| 2005/0099751 A1 | 5/2005 | Kumagai |
| 2011/0012542 A1 | 1/2011 | Inamura et al. |
| 2014/0001839 A1 | 1/2014 | Kakimoto |
| 2018/0088615 A1 | 3/2018 | Mori et al. |

FOREIGN PATENT DOCUMENTS

| | | |
|---|---|---|
| DE | 10 2013 212 262 A1 | 1/2014 |
| JP | H05-235696 A | 9/1993 |
| JP | H10070878 A | 3/1998 |
| JP | 2002119044 A | 4/2002 |
| JP | 2005151631 A | 6/2005 |
| JP | 2007509593 A | 4/2007 |
| JP | 2008017625 A | 1/2008 |
| JP | 2012146586 A | 8/2012 |
| JP | 2013-5067 A | 1/2013 |
| WO | 2005/039029 A2 | 4/2005 |
| WO | 2017/098849 A1 | 6/2017 |

OTHER PUBLICATIONS

An Office Action issued by the Japanese Patent Office dated Feb. 25, 2020, which corresponds to Japanese Patent Application 2019-537559 and is related to U.S. Appl. No. 16/615,613.

An Office Action mailed by the German Patent Office dated Mar. 12, 2021, which corresponds to German Patent Application No. 112018004716.4 and is related to U.S. Appl. No. 16/615,613; with English language translation.

F I G . 4
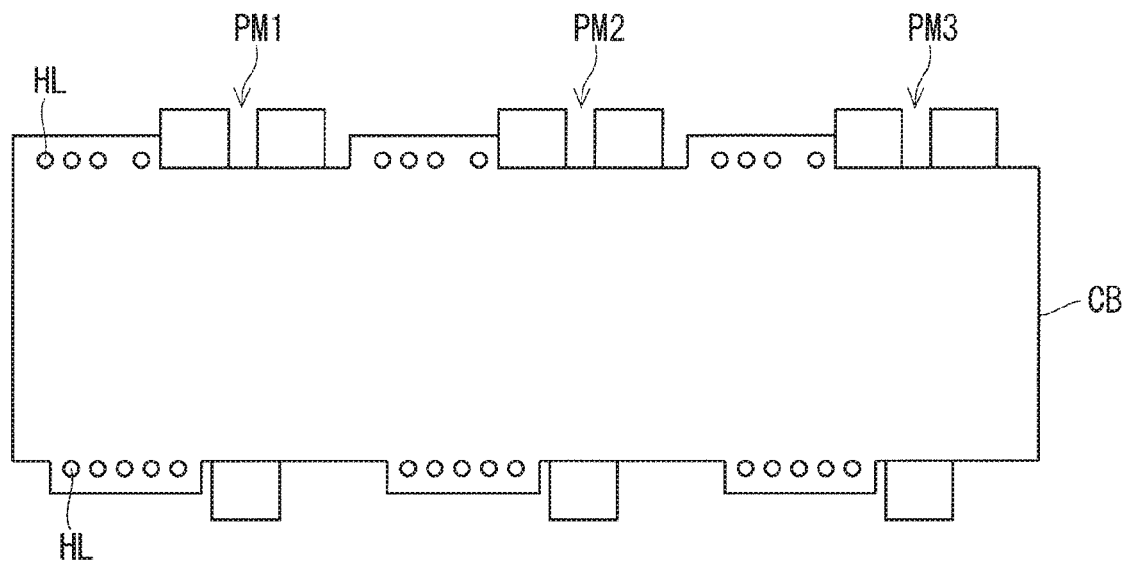
F I G . 5
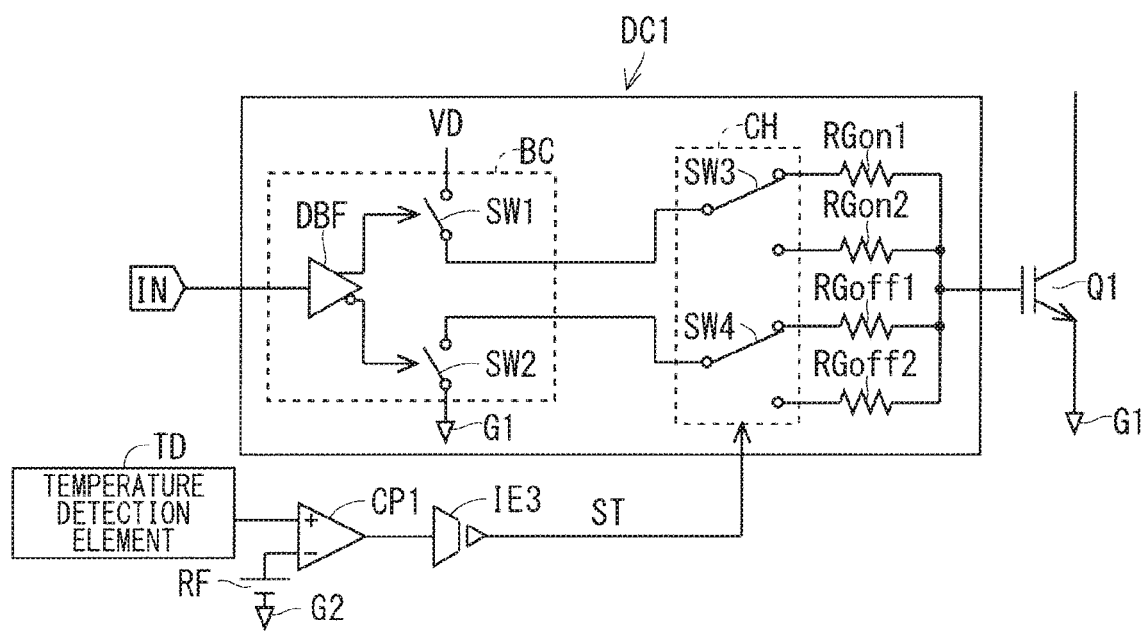

F I G. 6
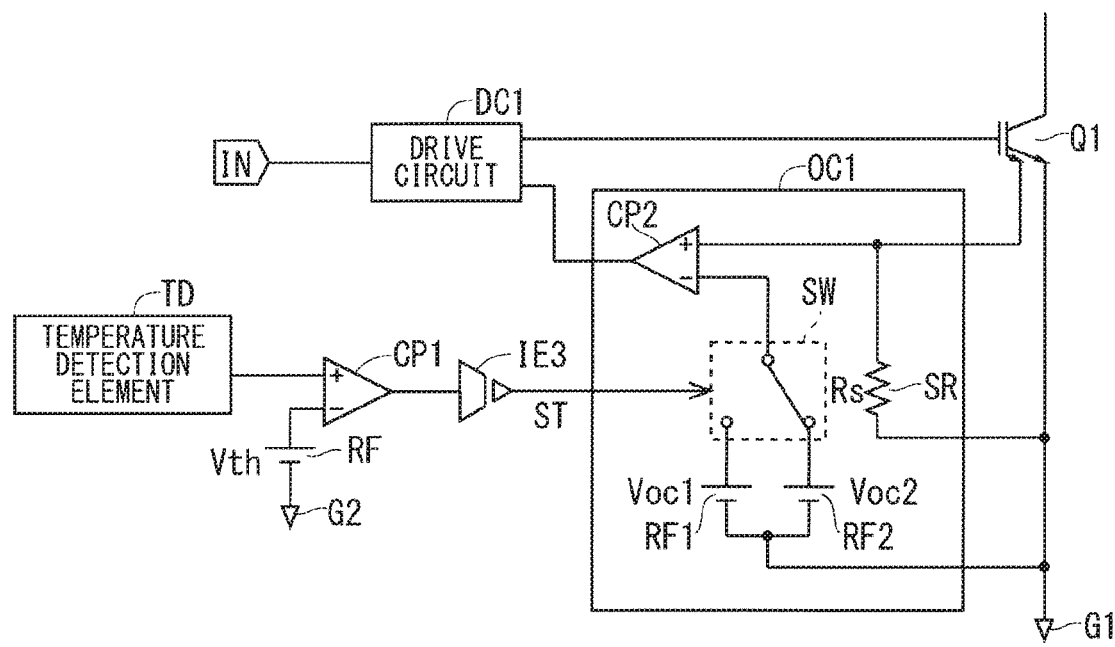

POWER CONVERSION DEVICE

TECHNICAL FIELD

The present invention relates to a control circuit of a switching device and a power conversion device including the control circuit.

BACKGROUND ART

The prior art teaches that known in a control circuit driving and protecting a semiconductor module is a technique of changing a gate resistance and an overcurrent protection threshold value in accordance with a temperature of a switching device and a module case. Various switching device characteristics such as withstand voltage and switching loss have temperature dependency; thus a low-loss and high-reliability control circuit can be achieved by using an appropriate circuit constant at each temperature.

Patent Document 1 discloses a technique of switching turn-off gate resistance in a drive circuit in accordance with a temperature of a module case and a temperature of a switching device. When the configuration disclosed in Patent Document 1 is used, the turn-off gate resistance can be set large at a low temperature, and can be set small at a high temperature.

Patent Document 2 discloses a technique of correcting an overcurrent protection threshold value in accordance with a temperature of the switching device in an overcurrent protection circuit in a switching device including a current detection element. Output sensitivity of a current detection element built into a switching device generally has temperature characteristics, and the output sensitivity increases at a high temperature and an overcurrent protection level decreases. When the configuration in Patent Document 2 is used, a threshold value of overcurrent protection is changed in accordance with a temperature of the switching device, thus decrease in the overcurrent protection level can be reduced.

PRIOR ART DOCUMENTS

Patent Documents

Patent Document 1: Japanese Patent Application Laid-Open No. 2002-119044
Patent Document 2: International Publication No. 2017/098849

SUMMARY

Problem to be Solved by the Invention

When the configurations of Patent Documents 1 and 2 are applied to an inverter circuit, a temperature detection element and a temperature determination circuit are provided in each of the switching device constituting the inverter circuit. This requires, a reference power source for determining an output signal and an element such as a comparator are necessary for each temperature detection element included in each switching device, so that the number of circuit elements in the control circuit increases. When multiple switching devices and temperature detection elements are housed in the same package and modularized, terminals, corresponding to the number of switching devices, for taking out a signal being output from the temperature detection elements are necessary, so that a size of the module also increases.

The present invention therefore has been made to solve the above problems, and it is an object of the present invention to provide a control circuit capable of suppressing increase in size of a semiconductor module in a control circuit controlling a switching device.

Means to Solve the Problem

A control circuit according to the present invention is a control circuit controlling first and second switching devices which are serially connected between first potential and second potential lower than the first potential and operate in a complementary manner. The control circuit includes a first control circuit controlling the first switching device and a second control circuit controlling the second switching device, and performs variable control of a circuit constant of each of the first and second control circuits based on a temperature of one of the first and second switching devices.

Effects of the Invention

According to the control circuit described above, increase in size of a module can be suppressed when the first and second switching devices are modularized.

BRIEF DESCRIPTION OF DRAWINGS

FIG. 4 A planar view illustrating a configuration that a control substrate is disposed on an upper side of the power module.
FIG. 5 A diagram illustrating an example of a configuration of a drive circuit.
FIG. 6 A diagram illustrating an example of a configuration of an overcurrent protection circuit.

DESCRIPTION OF EMBODIMENT(S)

Embodiment

Figure 1:
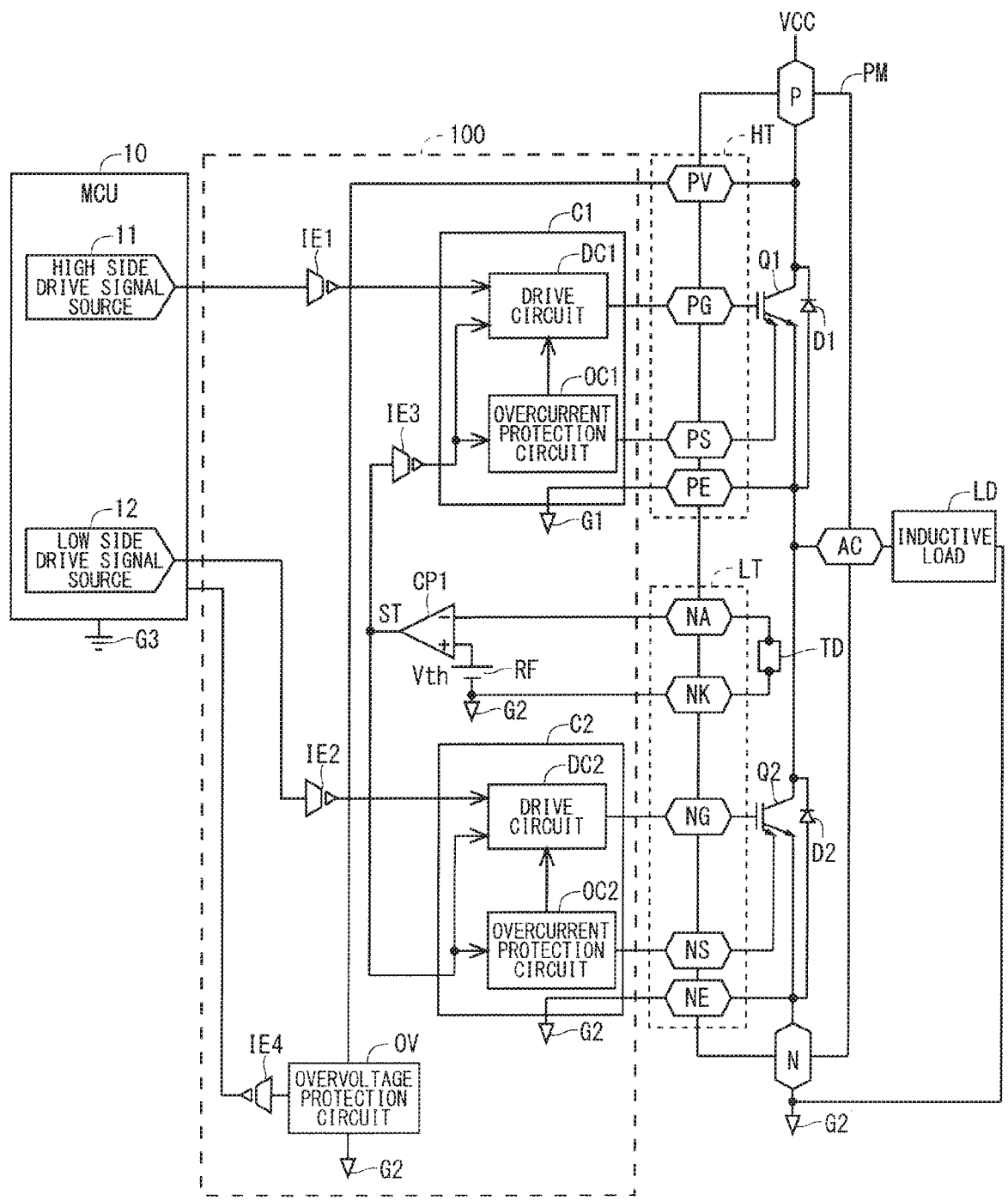
FIG. 1 A drawing illustrating a configuration of a control circuit according to an embodiment of the present invention.

FIG. 1 is a drawing illustrating a configuration of a control circuit 100 according to an embodiment of the present invention, and also illustrated are a power module PM (semiconductor module) controlled by the control circuit 100 and a micro-controller unit (MCU) 10 supplying a drive signal to the control circuit 100.

As illustrated in FIG. 1, the power module PM includes switching devices Q1 and Q2 serially connected between a main electrode terminal P (a first main electrode terminal) to which power source voltage VCC is supplied and has first potential and a main electrode terminal N (a second main electrode terminal) to which potential G2 is supplied and has second potential. The control circuit 100 controls the switching devices Q1 and Q2 so that they operate in a complementary manner. The switching devices Q1 and Q2 are each illustrated as an insulated gate bipolar transistor (IGBT) in FIG. 1, but are not limited to the IGBT.

An emitter and a collector in each of the switching devices Q1 and Q2 are connected to an output electrode terminal AC in common. The output electrode terminal AC is connected to one terminal of an inductive load LD such as a coil of a motor, and the other end of the inductive load LD is connected to the potential G2. Diodes D1 and D2 are anti-parallelly connected to each of the switching devices Q1 and Q2. The diodes D1 and D2 each function as a freewheel diode flowing freewheel current in the inductive load connected to the output electrode terminal AC.

Herein, the switching device Q1 (the first switching device) is a switching device on a high potential side (high side) operating on potential of the output electrode terminal AC as reference potential, and the switching device Q2 (the second switching device) is a switching device on a low potential side (low side) operating on potential of the main electrode terminal N to which the potential G2 is supplied as reference potential.

The collector of the switching device Q1 is also connected to a power source voltage detection terminal PV, a gate of the switching device Q1 is connected to a gate terminal PG, and the emitter of the switching device Q1 is also connected to an emitter terminal PE. The switching device Q1 has a built-in current detection element, and an output terminal thereof is connected to a current sense terminal PS.

The power source voltage detection terminal PV, the gate terminal PG, the current sense terminal PS, and the emitter terminal PE are collectively referred to as a high side signal terminal group HT.

The emitter of the switching device Q2 is also connected to an emitter terminal NE, and a gate of the switching device Q2 is connected to a gate terminal NG. The switching device Q2 has a built-in current detection element, and an output terminal thereof is connected to a current sense terminal NS. A temperature detection element TD for detecting a temperature is provided near the switching device Q2, and the temperature detection element TD is connected to the temperature detection signal terminals NA and NK. A temperature detection diode, for example, can be used as the temperature detection element TD. The temperature detection element TD is provided near the switching device Q2 in a circuit diagram form, however, the temperature detection element TD is actually disposed to be closely attached to the switching device Q2.

The emitter terminal NE, the current sense terminal NS, the gate terminal NG, the temperature detection signal terminals NA and NK are collectively referred to as a low side signal terminal group LT. The control circuit 100 includes a control circuit C1 (a first control circuit) for driving and protecting the switching device Q1, a control circuit C2 (a second control circuit) for driving and protecting the switching device Q2, a determination circuit CP1 for detecting that a signal being output by the temperature detection element TD in the power module PM exceeds a certain value, an overvoltage protection circuit OV for the power source voltage VCC in the power module PM, and insulation elements IE1, IE2, IE3, and IE4 for insulating signals having different potential. A photo coupler or a digital isolator, for example, are used as the insulation elements IE1 to IE4. The digital isolator achieves an insulation function similar to the photo coupler, and performs isolation using a magnetic connection. The digital isolator transmits a signal by a pair of magnetic coils in which micro coils manufactured in a semiconductor manufacturing process face with an insulator therebetween.

An input of the overvoltage protection circuit OV is connected to the power source voltage detection terminal PV of the power module PM, the power source voltage VCC is pressure-divided in the overvoltage protection circuit OV, and a partial pressure value is transmitted to the MCU 10 via the insulation element IE4. The reference potential of the overvoltage protection circuit OV is the potential G2.

In the determination circuit CP1, a threshold voltage Vth set by a reference power source RF is input to a non-inversion input terminal (+) and a signal being output by the temperature detection element TD is input to an inversion input terminal (−) via the temperature detection signal terminal NA, and the determination circuit CP1 is made up of a comparator comparing the threshold voltage Vth and the signal and outputting a comparison result. A positive electrode of the reference power source RF is connected to the non-inversion input terminal of the determination circuit CP1, a negative electrode is connected to a temperature detection signal terminal NK, and the potential G2 is supplied.

When the signal being output by the temperature detection element TD exceeds the threshold voltage Vth, the determination circuit CP1 outputs a temperature switching signal ST. The temperature switching signal ST is input to the control circuits C1 and C2. The control circuits C1 and C2 performs a variable control of a circuit constant upon receiving the temperature switching signal ST as a trigger.

Herein, the control circuit C1 and the control circuit C2 operate n the potential G1 and the potential G2 different from each other as the reference potential, respectively, and the temperature switching signal ST is transmitted to the high side control circuit C1 via the insulation element IE3.

The control circuit C1 includes a drive circuit DC1 (a first drive circuit) drive-controlling the switching device Q1 and an overcurrent protection circuit OC1 (a first overcurrent protection circuit) of the switching device Q1. An output of the drive circuit DC1 is connected to the gate terminal PG of the power module PM, and an input of the overcurrent protection circuit OC1 is connected to the current sense terminal PS of the power module PM. The potential G1 is supplied to the emitter terminal PE.

The control circuit C1 has a configuration of supplying feedback of the overcurrent detection signal from the overcurrent protection circuit OC1 to the drive circuit DC1, and the drive circuit DC1 performs control of turning off the switching device Q1, for example, at a time of detecting the overcurrent. The temperature switching signal ST is input to the drive circuit DC1 and the overcurrent protection circuit OC1 via the insulation element IE3. The configurations of the drive circuit DC1 and the overcurrent protection circuit OC1 are described hereinafter.

The control circuit C2 includes a drive circuit DC2 (a second drive circuit) drive-controlling the switching device Q2 and an overcurrent protection circuit OC2 (a second overcurrent protection circuit) of the switching device Q2. An output of the drive circuit DC2 is connected to the gate terminal NG of the power module PM, and an input of the overcurrent protection circuit OC2 is connected to the current sense terminal NS of the power module PM. The potential G2 is supplied to the emitter terminal NE.

The control circuit C2 has a configuration of supplying feedback of the overcurrent detection signal from the overcurrent protection circuit OC2 to the drive circuit DC2, and the drive circuit DC2 performs control of turning off the switching device Q2, for example, at a time of detecting the overcurrent. The temperature switching signal ST is input to the drive circuit DC2 and the overcurrent protection circuit OC2.

A high side drive signal being output from a high side drive signal source 11 in the MCU 10 is supplied to the drive circuit DC1 via the insulation element IE1, and a low side drive signal being output from a low side drive signal source 12 in the MCU 10 is supplied to the drive circuit DC2 via the insulation element IE2. Herein, the MCU 10 operates on potential G3, different from the potentials G1 and G2, as the reference potential, thus supplies the drive signal via the insulation elements IE1 and IE2 as described above.

The control circuit 100 described above detects the temperature of the switching device Q2 using the temperature detection element TD in the power module PM, and based on a detection result thereof, performs the variable control in accordance with the temperature of the switching device of the circuit constant of the control circuits C1 and C2. Accordingly, one determination circuit CP1 suffices for determining the detection result obtained by the temperature detection element TD, and a circuit configuration of the control circuit 100 can be simplified and the control circuit 100 can be downsized.

In the power module in which the plurality of switching devices are housed in one package, some of the switching devices need the temperature detection element and the temperature detection signal terminal, thus a module configuration can be simplified.

Particularly, in an inverter circuit which is one type of the power conversion device, average values of each current flowing in two switching devices which are half-bridge connected are equal to each other, and temperatures of those switching devices are deemed to be substantially the same, thus the variable control of the circuit constants of the control circuits of both switching devices can be accurately achieved only with temperature information of one switching device. Accordingly, when the two switching devices which are half-bridge connected are modularized to be housed in one package, the temperature detection signal terminal can be reduced in number, and the module size can be reduced.

Figure 2:
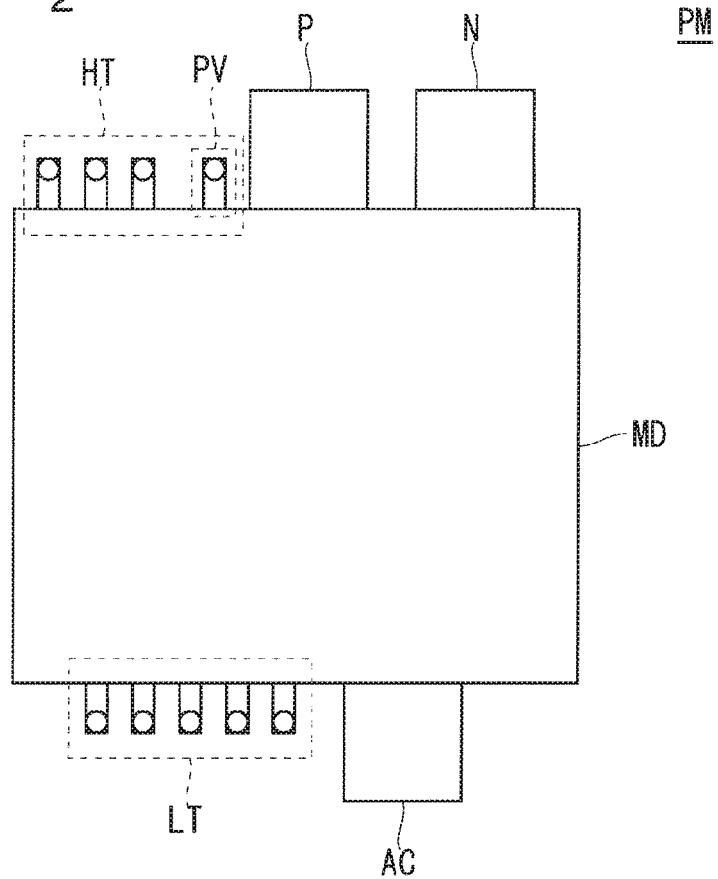
FIG. 2 A planar view illustrating an appearance of a power module.

FIG. 2 is a planar view illustrating an appearance of the power module PM illustrated in FIG. 1, and is a drawing of a resin package MD viewed from an upper surface side. As illustrated in FIG. 2, the main electrode terminals P and N protrude side by side from a side surface on a long side, located on an upper side in the drawing, in two long sides of the resin package MD having a rectangular shape in a plan view. The high side signal terminal group HT protrudes to be arranged along the main electrode terminal P on an opposite side of a side on which the main electrode terminal N protrudes. The power source voltage detection terminal PV having the same potential as the main electrode terminal P is disposed adjacent to the main electrode terminal P, and the other terminal is disposed at a certain distance from the power source voltage detection terminal PV. The output electrode terminal AC protrudes from a side surface on a long side located on a lower side in the drawing, and the low side signal terminal group LT protrudes to be arranged along the output electrode terminal AC.

In order to reduce inductance of the half-bridge circuit as much as possible, the main electrode terminal P and the main electrode terminal N are disposed side by side, and the output electrode terminal AC is disposed in the position facing the main electrode terminals P and N. The high side signal terminal group HT and the low side signal terminal group LT have the reference potentials different from each other, thus are disposed in the positions facing each other.

It is preferable that the high side signal terminal group HT is disposed on a side where the main electrode terminal P and the main electrode terminal N are located and the low side signal terminal group LT is disposed on a side where the output electrode terminal AC is located so that a design of the control substrate on which the control circuit 100 is provided is simplified.

Figure 3:
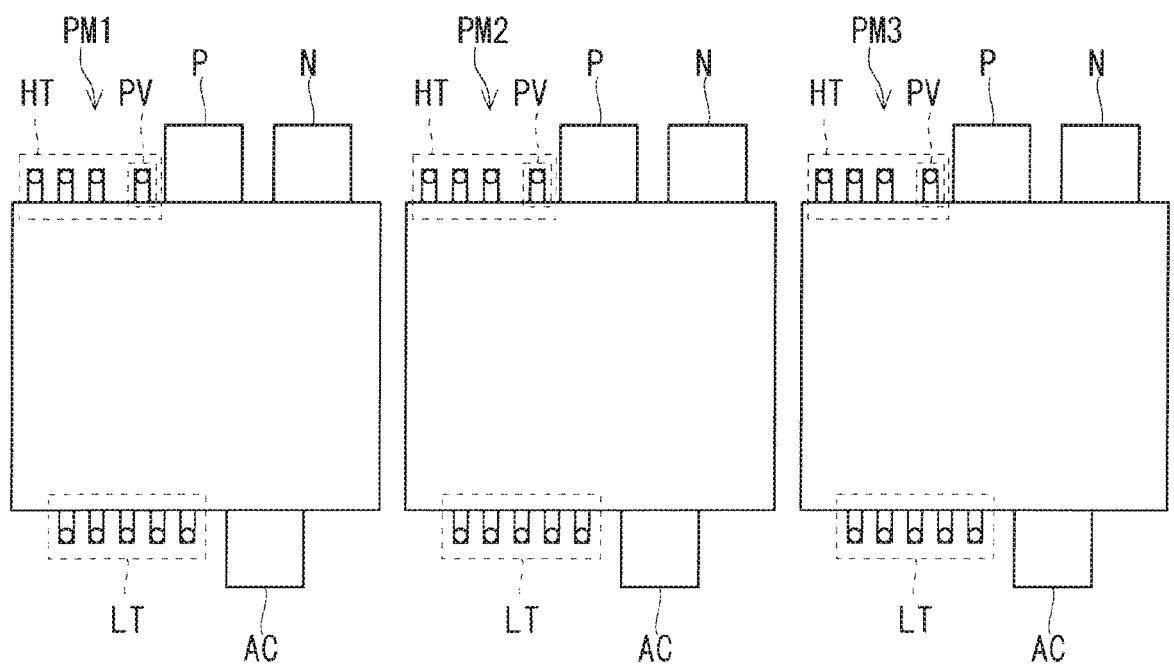
FIG. 3 A planar view illustrating a configuration of three power modules linearly arranged.

The reason for it is described using FIG. 3 and FIG. 4. FIG. 3 is a planar view illustrating a case of linearly arranging three power modules having the half-bridge circuit to constitute a three-phase bridge.

As illustrated in FIG. 3, power modules PM1, PM2, and PM3 are linearly arranged, and side surfaces where the main electrode terminals P and N protrude are arranged in line, and side surfaces where the output electrode terminal AC protrudes are arranged in line. Each of the power modules PM1 to PM3 is the same as the power module PM illustrated in FIG. 1.

According to such a configuration, the high side signal terminal groups HT in the power modules are arranged in line, and the low side signal terminal groups LT are arranged in line on the opposite side, thus as illustrated in FIG. 4, a layout design of the control substrate CB can be easily performed when the control substrate CB is disposed on an upper side of the arrangement of the power modules PM1 to PM3. That is to say, as illustrated in FIG. 4, the signal terminal group is inserted into a plurality of through holes HL located on the two long sides of the control substrate CB and is electrically connected to the control circuit 100 located on the control substrate CB. Since the signal terminal groups are arranged on an end edge of the control substrate CB, the layout design of the control substrate CB can be easily performed. In FIG. 4, a specific arrangement of the control circuit 100 is omitted.

A terminal width needs to be increased from necessity for reducing contact resistance at a time of connecting a smoothing capacitor and an external electrode by reason that large current flows, so that when the number of signal terminals is increased, the package size also increase on a side where the main electrode terminals P and N are located adjacent to the high side signal terminal group HT in the power module. Additionally, the high side signal terminal group HT needs to include the power source voltage detection terminal PV, and a sufficient spatial distance should be retained between the power source voltage detection terminal PV to which high voltage is added and the other signal terminal, so that a space occupied by the signal terminal group increases and the package size further increases.

In the meanwhile, only the output electrode terminal AC flows large current on a side where the low side signal terminal group LT is located in the power module, thus the number of signal terminals in the signal terminal group can be easily increased on that side compared with a side where the main electrode terminals P and N are located. Thus, the package size does not increase even when the temperature detection signal terminals NA and NK are provided. This configuration has an advantage caused by detecting the temperature of the low side switching device Q2, and the package size can be reduced compared with the case of also detecting the temperature of the high side switching device Q1.

When the increase in the package size caused by the increase in the number of signal terminals in the high side signal terminal group HT is within an allowable range, it is also applicable to detect the temperature of the high side switching device Q1.

Next, an example of a configuration of the drive circuit DC1 is described using FIG. 5. As illustrated in FIG. 5, the drive circuit DC1 includes a buffer circuit BC having a drive buffer DBF, turn-on gate resistances RGon1 and RGon2 as circuit constants, and a gate resistance switching circuit CH switching turn-off gate resistances RGoff1 and RGoff2.

The buffer circuit BC is a circuit supplying drive voltage VD to the gate of the switching device Q1 to turn on the switching device Q1 or sinking the potential to the potential G1 to turn off the switching device Q1 based on the high side drive signal, which is the drive signal being input to the drive buffer DBF and output from the high side drive signal source 11 in the MCU 10 (FIG. 1). When the drive voltage VD is supplied to the gate, output from the drive buffer DBF is a signal for controlling a switch SW1 so that the drive voltage VD is applied via the switch SW1, and when the potential of the gate is sunk to the potential G1, output from the drive buffer DBF is a signal for controlling a switch SW2 so that the potential is sunk to the potential G1 via the switch SW2.

The turn-on gate resistances RGon1 and RGon2 and the turn-off gate resistances RGoff1 and RGoff2 have different gate resistance values, respectively, and magnitude relationships therebetween are RGon1>RGon2 and RGoff1>RGoff2. The gate resistance switching circuit CH controls a switch SW3 or SW4 so that the gate resistance is switched to RGon2 or RGoff2 of small resistance value when the switching device Q1 has a high temperature, and controls a switch SW3 or SW4 so that the gate resistance is switched to RGon1 or RGoff1 of large resistance value when the switching device Q1 has a low temperature, that is to say, the switching device Q1 does not have a high temperature, upon receiving the temperature switching signal ST as a trigger.

The switching device generally has a large switching speed and a large surge voltage generated therein at a low temperature. Thus, it is preferable to select a large gate resistance value so that the surge voltage does not exceed withstand voltage at a low temperature. However, when the gate resistance value is large, the switching loss increases at a high temperature, thus when the switching device has a high temperature, both the reduction in the surge voltage at a low temperature and the reduction in the switching loss at a high temperature can be achieved by changing the gate resistance to a small value by the variable control of the gate resistance based on a device temperature. FIG. 5 illustrates an example of the configuration of the drive circuit DC1, however, the same applies to the configuration of the drive circuit DC2, thus the description thereof is omitted.

Next, an example of a configuration of the overcurrent protection circuit OC1 is described using FIG. 6. As illustrated in FIG. 6, the overcurrent protection circuit OC1 converts sense current being output from the current sense terminal, which outputs current correlated to the main current of the switching device Q1, into sense voltage by the sense resistance SR, and detects that the sense voltage exceeds a threshold value voltage Voc1 or Voc2 which is a detection threshold value by the comparator CP2, thereby achieving the overcurrent protection. Herein, each of the threshold voltage values Voc1 and Voc2 is a circuit constant and set to a different voltage value by reference power sources RF1 and RF2, and a magnitude relationship thereof is Voc1>Voc2.

The overcurrent protection circuit OC1 switches the threshold value voltage Voc1 or Voc2 by the switch SW and supplies it to an inversion input of the comparator CP2, thereby performing a comparison with the sense voltage supplied to the non-inversion input of the comparator CP2, upon receiving the temperature switching signal ST as a trigger.

That is to say, the threshold value voltage Voc1 of large voltage value is supplied to the comparator CP2 when the switching device Q1 has a high temperature, and the threshold value voltage Voc2 of the small voltage value is supplied to the comparator CP2 when the switching device Q1 has a low temperature, that is to say, the switching device Q1 does not have a high temperature.

The switching device generally has a large detection sensitivity of the current detection element at a high temperature, thus a detected current value is large even when the main current is as small as normal operation current, and the overcurrent protection level decrease in accordance with increase in the device temperature. Thus, there is a problem that the overcurrent protection level decreases to the normal operation current or less at a high temperature or conversely, increases excessively at a low temperature. However, the threshold value voltage of the comparator CP2 is set high at a high temperature in accordance with the variable control of the threshold value voltage based on the device temperature, thus temperature dependency of the overcurrent protection level can be reduced.

The output of the comparator CP2 is supplied to the drive circuit DC1 as the overcurrent detection signal, and the drive circuit DC1 performs control of turning off the switching device Q1 at a time of detecting the overcurrent. Since a configuration for those operations is achieved by a known technique, the illustration and the description thereof are omitted. FIG. 6 illustrates an example of the configuration of the overcurrent protection circuit OC1, however, the same applies to the configuration of the overcurrent protection circuit OC2, thus the description thereof is omitted.

FIG. 6 illustrates the configuration that the threshold value voltage of the comparator CP2 is variable as an example, however, the similar effect can be obtained also by a configuration of preparing a plurality of resistance values Rs of the sense resistance SR as circuit constants and switching them upon receiving the temperature switching signal ST as a trigger. In this case, the resistance value Rs is switched to low when the switching device Q1 has a high temperature, and switched to high when the switching device Q1 has a low temperature.

The configuration of performing the variable control of the threshold value voltage based on the device temperature illustrated in FIG. 6 needs not be necessarily provided in the overcurrent protection circuit, but applicable is a configuration of a conventional overcurrent protection circuit performing the variable control of the gate resistance based on the device temperature on the drive circuit.

The configuration of performing the variable control of the gate resistance based on the device temperature illustrated in FIG. 6 needs not be necessarily provided in the drive circuit, but applicable is a configuration of a conventional drive circuit performing the variable control of the threshold value voltage based on the device temperature on the overcurrent protection circuit.

The present invention has been shown and described in detail, the foregoing description is in all aspects illustrative and not restrictive. It is therefore understood that numerous modifications and variations can be devised without departing from the scope of the invention.

According to the present invention, each embodiment can be appropriately varied or omitted within the scope of the invention.

The invention claimed is:
1. A power conversion device, comprising:
a control circuit controlling first and second switching devices which are serially connected between first potential and second potential lower than the first potential and operate in a complementary manner; and a semiconductor module in which the first and second switching devices are housed in an identical package; wherein the control circuit includes:

a first control circuit controlling the first switching device; and a second control circuit controlling the second switching device, wherein the control circuit performs variable control of a circuit constant of each of the first and second control circuits based on a temperature of one of the first and second switching devices, and the semiconductor module includes:

a first main electrode terminal provided on one side surface of the package;

a second main electrode terminal provided on one side surface of the package;

an output electrode terminal provided on a side surface located on an opposite side of the one side surface of the package;

a high side signal terminal group provided on the one side surface of the package and connected to the first switching device;

a low side signal terminal group provided on the side surface located on the opposite side of the one side surface of the package and connected to the second switching device; and a temperature detection element detecting the temperature of the second switching device, wherein the low side signal terminal group includes a temperature detection signal terminal.

* * * * *